United States Patent [19]

Okazawa et al.

[11] Patent Number: 4,716,131
[45] Date of Patent: Dec. 29, 1987

[54] METHOD OF MANUFACTURING SEMICONDUCTOR DEVICE HAVING POLYCRYSTALLINE SILICON LAYER WITH METAL SILICIDE FILM

[75] Inventors: Takeshi Okazawa; Yoshiyuki Hirano, both of Tokyo, Japan

[73] Assignee: NEC Corporation, Tokyo, Japan

[21] Appl. No.: 675,768

[22] Filed: Nov. 28, 1984

[30] Foreign Application Priority Data

Nov. 28, 1983 [JP] Japan ............................. 58-223717
Nov. 30, 1983 [JP] Japan ............................. 58-225814

[51] Int. Cl.$^4$ ............................................ H01L 21/283
[52] U.S. Cl. ................................. 437/200; 437/193; 437/41; 437/983
[58] Field of Search ............... 29/589, 590, 591, 571; 148/DIG. 147; 437/93; 357/23.1, 23.7

[56] References Cited

U.S. PATENT DOCUMENTS

| | | | |
|---|---|---|---|
| 4,180,596 | 12/1979 | Crowder et al. | 427/42 |
| 4,227,944 | 10/1980 | Brown et al. | 148/6 |
| 4,305,200 | 12/1981 | Fu et al. | 29/571 |
| 4,389,257 | 6/1983 | Geipel, Jr. et al. | 148/1.5 |
| 4,430,292 | 2/1984 | Temple | 29/571 |
| 4,459,325 | 7/1984 | Notawa et al. | 427/93 |
| 4,545,114 | 10/1985 | Ito et al. | 29/529 |
| 4,593,454 | 6/1986 | Baudrant et al. | 29/571 |

Primary Examiner—Brian E. Hearn
Assistant Examiner—T. N. Quach
Attorney, Agent, or Firm—Burns, Doane, Swecker & Mathis

[57] ABSTRACT

A metal silicide film is formed on the sides of a polycrystalline silicon layer formed on a semiconductor substrate via an insulating film and the surface of the metal silicide film is covered by a silicon oxide film, whereby the silicon layer has a low electrical resistance and no short-circuiting is necessary. For example, in an insulated gate field effect transistor, the gate electrode is constituted by the polycrystalline silicon layer and the metal silicide film at the side walls of the polycrystalline silicon layer. Such a gate electrode has a low electrical resistance and does not cause undesirable short-circuiting with source and drain regions by the existence of the silicon oxide film formed on the surface of the metal silicide film. Also, other metal silicide film may be formed on the upper surface of the gate electrode. Moreover the silicide-SiO$_2$ structure may be used on the source and drain regions.

2 Claims, 17 Drawing Figures

METHOD OF MANUFACTURING SEMICONDUCTOR DEVICE HAVING POLYCRYSTALLINE SILICON LAYER WITH METAL SILICIDE FILM

BACKGROUND OF THE INVENTION

This invention relates to a semiconductor device having a wiring layer or electrode made of polycrystalline silicon and metal silicide thereon and method of manufacturing the semiconductor device.

Recently, for reducing the electrical resistance of polycrystalline silicon gate electrodes or polycrystalline silicon wiring layers formed on a semiconductor substrate or source and drain regions or diffused wiring layers formed in a major surface of a semiconductor substrate of single crystal silicon as low as possible, it has frequently been practiced to form a metal silicide film on the upper surface of these electrodes, layers, or regions. The metal silicide film is formed, for example, by vapor-depositing a refractory metal having a high melting point such as molybdenum, tungsten, titanium, tantalum, etc., or platinum on the polycrystalline silicon or single crystal silicon and applying thereto a heat treatment to cause a thermal reaction of the metal and silicon. However, in the foregoing conventional technique, there is an anxiety of causing short-circuiting between the silicide film on the polycrystalline silicon formed on a semiconductor substrate and impurity regions such as source and drain regions in the semiconductor substrate.

SUMMARY OF THE INVENTION

An object of this invention is, therefore, to provide a semiconductor device having a wiring layer or electrode made of polycrystalline silicon layer and metal silicide film on the silicon layer on a semiconductor substrate and causing no short-circuiting between the semiconductor substrate and the wiring layer or electrode.

Other object of this invention is to provide an effective method of manufacturing the foregoing semiconductor device.

According to one feature of this invention, there is provided a semiconductor device comprising a semiconductor substrate, an insulating film formed on the major surface of the semiconductor substrate, a wiring layer or electrode formed on the insulating film, the wiring layer or electrode including a polycrystalline silicon layer on the insulating film and a metal silicide film formed at side surfaces of the polycrystalline silicon layer, and a silicon oxide film formed on tne metal silicide.

According to this invention, the metal silicide film can be completely covered by the silicon oxide film, and therefore, short-circuiting between the silicide film and the semiconductor substrate is not caused. The thermal oxidation of the metal silicide film and the silicon layer are preferable to form the silicon oxide film thereon.

In the semiconductor device of this invention, it is preferred that the metal silicide film formed at the side of a polycrystalline silicon layer is composed of a refractory metal such as molybdenum, tungsten, tantalum, titanium, etc. and polycrystalline silicon. In the case of an insulated gate field effect transistor (hereinafter abbreviated as IGFET), the polycrystalline silicon layer and metal silicide films formed at the sides thereof form gate electrode and a portion of a semiconductor substrate disposed under both sides form source region and drain regions. In the case of complementary IGFET, an n-type silicon gate electrode or wiring layer of an n-channel type IGFET and a p-type silicon gate electrode or wiring layer of p-channel type IGFET can be directly connected each other. Because the metal silicide film continuously provided at the side faces of the n-type silicon layer and the p-type silicon layer can effectively prevent to form an undesirable diode function by the pn junction between the two kinds of silicon layers.

Moreover, the metal silicide film can be formed on a portion of the semiconductor substrate such as on the source or drain region of IGFET and the thermal oxidation film may be provided on the metal silicide film of the source or drain region. In this case, the above mentioned short-circuiting problem between the gate electrode and the source or drain region can be more effectively prevented. Furthermore, another metal silicide of a metal such as platinum, etc., may be formed on the upper surface of a polycrystalline silicon layer. In this case, it is preferred that the metal silicide which is formed on the upper surface of the polycrystalline silicon layer is formed by using a metal capable of forming at a lower temperature than the temperature of forming the above-described metal silicide film at the sides of the polycrystalline silicon layer.

According to another aspect of this invention, there is provided a method of manufacturing a semiconductor device comprising steps of forming a first silicon oxide film on the major surface of a single crystal silicon substrate of one conductivity type, forming a polycrystalline silicon layer on the first silicon oxide film, forming an oxidation resisting film such as silicon nitride film on the polycrystalline silicon layer, patterning the oxidation resisting film and the polycrystalline silicon layer, depositing a first metal film on the whole surface of the silicon substrate, performing a heat treatment to form a first metal silicide film at the exposed side surfaces of the patterned polycrystalline silicon layer, removing the first metal film at the regions where the first metal silicide is not formed, and forming a second silicon oxide film on the surface of the first metal silicide film. The method may further comprises steps of removing the oxidation resisting film, depositing a second metal film on the whole surface thereof including the surface of the polycrystalline silicon layer from which the oxidation resisting film has been removed, applying a heat treatment to form a second metal silicide film by the second metal film on the upper surface of the polycrystalline silicon layer in direct contact with a second metal film, and removing the second metal film at the regions of not forming the second metal silicide. Favorably, the first metal is selected from a group consisting of molybdenum, tungsten, titanium and tantalum and the second metal is platinum. Moreover, the first metal may be directly deposited on portions of the semiconductor substrate, for example, on source and drain regions of IGFET, and forms metal silicide films covered by thermal oxidation silicon oxide films on the source and drain regions.

DESCRIPTION OF THE PRIOR ART

Figure 1A:
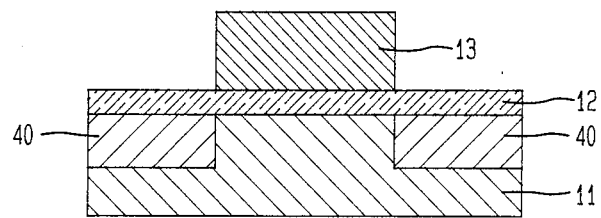
FIG. 1A to FIG. 1G are cross-sectional views successively showing the steps of manufacturing a semiconductor device by a conventional technique.
Figure 1B:
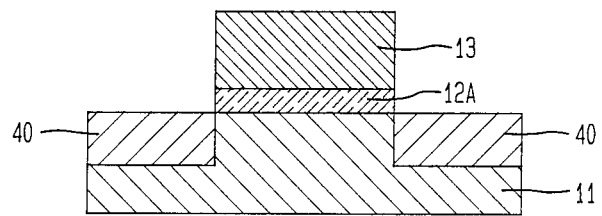
Figure 1C:
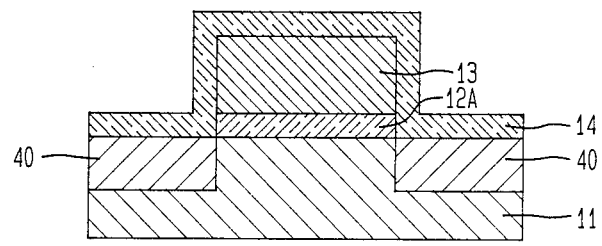
Figure 1D:
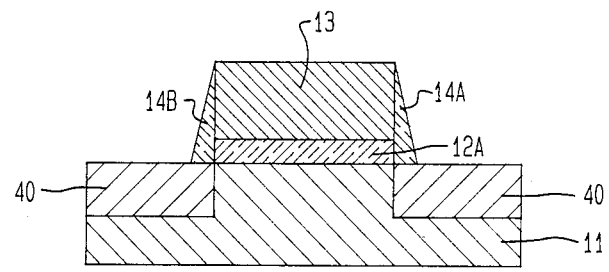
Figure 1E:
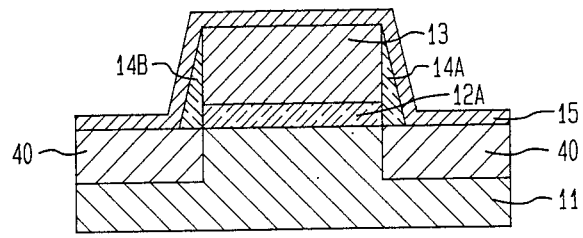
Figure 1F:
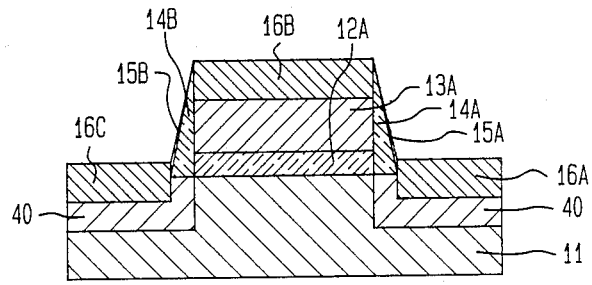
Figure 1G:
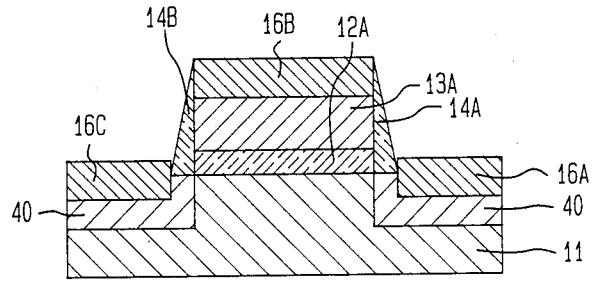

As shown in FIG. 1A, a silicon oxide film 12 is formed on a part of the surface of a silicon substrate 11 by, for example, a heat oxidation method. In the case of an IGFET, a part of the film becomes a gate insulating film. Then, a polycrystalline silicon gate electrode 13 is formed on the gate insulating film 12. Then, using the polycrystalline silicon layer, that is, the gate electrode 13 as a mask, regions 40, which become source and drain regions, are formed by introducing an impurity. Then, as shown in FIG. 1B, using the polycrystalline silicon layer 13 as a mask, portions of the silicon oxide film 12 on the source, drain regions 40 are removed by etching. The left portion 12a of the film become the gate insulating film. Then, as shown in FIG. 1C, a layer 14 of an insulating material such as silicon oxide is formed on the whole surface of the device by using a chemical vapour deposition (CVD) method. Then, as shown in FIG. 1D, the silicon oxide layer 14 is subjected to an anisotropic etching, such as reactive ion etching method to expose the surface of the regions 40 and the upper surface of the polycrystalline silicon layer 13 while leaving parts 14a and 14b of the silicon oxide layer 14 along the sides of the polycrystalline silicon layer 13. Then, as shown in FIG. 1E, a first metal film 15 is deposited over the surface of the whole device. Then, as shown in FIG. 1F, a heat treatment is applied to the first metal film 15, whereby the reaction of the first metal film 15 and silicon occurs only at the regions that the first metal film 15 is in contact with the silicon substrate 11 (impurity regions 40) and the upper surface of polycrystalline layer 13 to form metal silicide films 16a, 16b, and 16c. In this case, at the regions that the metal film 15 is in contact with the silicon oxide portions 14a and 14b, the metal film does not form the silicide to leave metal state portions 15a and 15b. Then, as shown in FIG. 1G, by performing proper etching treatment, parts of the metal film, i.e., the metal portions 15a and 15b left at the regions in contact with the portions 14a and 14b of silicon oxide can be selectively removed while leaving the metal silicide layers 16a, 16b and 16c, whereby a semiconductor device having the impurity regions and the polycrystalline silicon film of a reduced electrical resistance is obtained.

In the semiconductor device manufactured by the manner as described above, the metal silicide film formed on the surface of polycrystalline silicon and the surface of the silicon substrate largely contributes to reduce their electrical resistance. That is, the electrical resistance of a metal silicide is one to two figures lower than that of polycrystalline silicon, thereby it becomes possible to reduce the electrical resistance of polycrystalline silicon layer with the silicide film and the impurity region with the silicide film by about one figure as compared with that of conventional ones, that is, without the silicide film. The reduction of the electrical resistance can, as a matter of course, improved the operation performance.

However, the semiconductor device having the above-described structure and obtained by the manufacturing method as described above has various disadvantages.

That is, since the silicon oxide films 14a and 14b left at the sides of the polycrystalline silicon layer 13a are very small, it is difficult to form the silicon oxide films having always constant size. Also, there is an anxiety that the insulative layers are completely removed according to the anisotropic etching condition. Therefore, the structure is liable to cause short-circuiting or to become low withstand voltage characteristic. Moreover, in the step of removing the silicon oxide layer 14 by the anisotropic etching, a field oxide layer which separates respective element would be reduced its thickness, and therefore the sufficient isolation between elements cannot be expected.

DESCRIPTION OF THE EMBODIMENTS

Figure 2A:
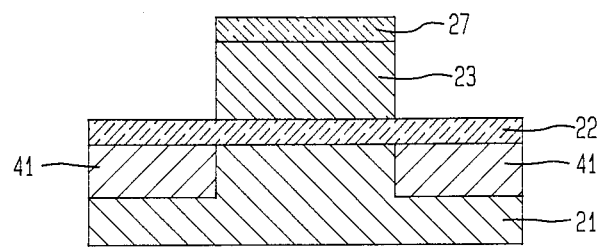
FIG. 2A to FIG. 2H are cross-sectional views successively showing the steps of manufacturing a semiconductor device of a first embodiment of this invention.

Referring to FIG. 2A, a silicon di-oxide film 22 of 500 Å thickness is formed on a major surface of a p-type single crystal (monocrystalline) semiconductor substrate 21 by thermal oxidation method. A polycrystalline silicon layer of 0.5 μm thickness and a silicon nitride film are successively formed on the silicon oxide film 22. Then, by using a known photoetching technique, a patterned silicon nitride film 27 and a patterned polycrystalline silicon layer 23 are formed. Next, by ion-implanting n-type impurity in the silicon substrate with the polycrystalline silicon layer 23 and the silicon nitride film 27 as a mask, n-type impurity regions 41 are formed. The regions 41 are used as source and drain regions when the devide is IGFET.

Figure 2B:
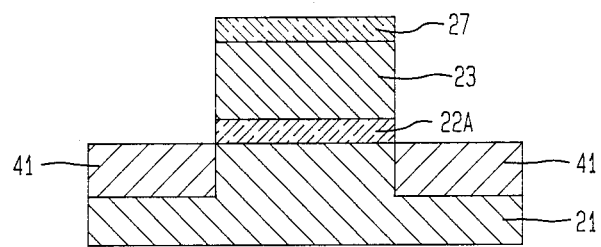
Figure 2C:
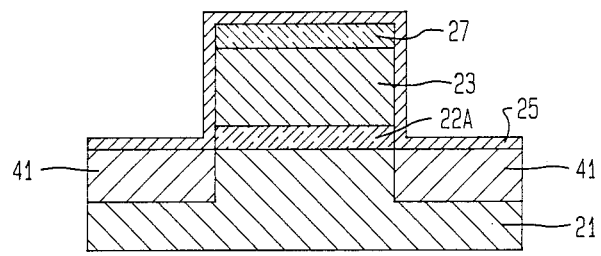

Then, as shown in FIG. 2B, the silicon oxide film 22 is selectively removed with the polycrystalline silicon layer 23 and the silicon nitride film 27 as a mask to form a silicon oxide film 22a which is a gate insulating film of IGFET. Then, as shown in FIG. 2C, a first metal film 25 of 300 Å thickness is deposited on the whole surface of the device. In addition, it is necessary to use a refractory metal having a high melting point such as molybdenum, tungsten, tantalum, titanium, etc., as the first metal.

Figure 2D:
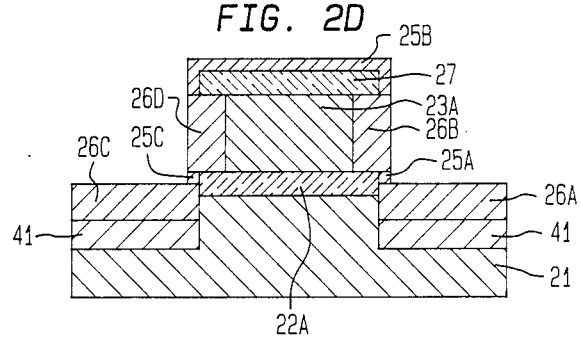

Then, as shown in FIG. 2D, by applying thereto a heat treatment under the conditions of nitrogen atmosphere, 600° to 700° C. temperature and 20 to 30 minutes, a reaction of the first metal and silicon occurs only at the regions that the first metal layer 25 is direct contact with the impurity regions 41 in the silicon substrate 21 and the polycrystalline silicon layer 23 to form first metal silicide films 26a and 26c and second metal silicide films 26b and 26d. Generally, the metal silicide ($MoSi_2$, $WSi_2$ or $TiSi_2$) has 500 Å to 1000 Å thickness. In addition, portions of the first metal film which are not in direct contact with the silicon substrate 21 and the polycrystalline silicon layer 23 remains as unreacted first metal films 25a, 25b, and 25c.

Figure 2E:
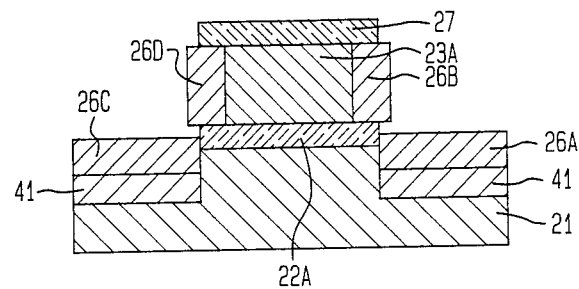
Figure 2F:
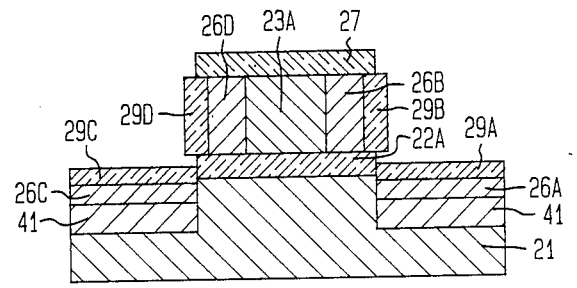
Figure 2G:
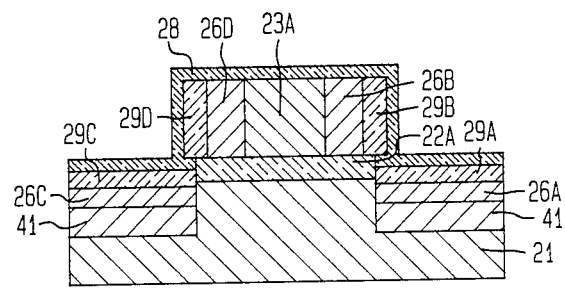
Figure 2H:
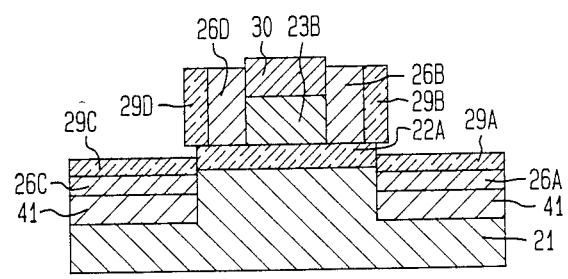

The unreacted first metal films are removed by wet etching (FIG. 2E). Next, a thermal oxidation is applied with the silicon nitride film 27 as a mask under the conditions of hydrogen-oxygen atmosphere, 900° to 950° C. temperature and 20 to 30 minutes. Then, silicon di-oxide films 29a, 29c, 29b and 29d of 500 Å to 1000 Å are formed on the metal silicide films 26a, 26c, 26b and 26d, respectively. When the surface of the metal silicide film is thermally oxidized, the silicon atom reacts with oxygen on the surface of the metal silicide film to form silicon oxide. In this case, the metal silicide film is forced in the inside of silicon, whereby a silicon oxide film is formed on the surface of the metal silicide film as shown in FIG. 2F. Then, as shown in FIG. 2G, after removing the silicon nitride film 27, a second metal film 28 is deposited on the whole surface of the device. The second metal for the second metal film is not necessary a metal having high melting point as the first metal and may be, for example, platinum, etc. Then, as shown in FIG. 2H, by applying a heat treatment of the same condition in FIG. 2E, a third metal silicide film 30 is formed at the upper surface of the polycrystalline silicon layer 23b. Thereafter, the unreacted portion of the second metal film, which is not in the metal silicide, is removed to provide a semiconductor device of IGFET as embodiment of this invention. Namely, the IGFET, which comprises the source region composed of n-type region 41 and the metal silicide film 26a, the drain region composed of n-type region 41 and the metal silicide film 26c, the gate insulating film 22a formed on a p-type channel region between the source and drain regions, and the gate electrode composed of the polycrystalline silicon layer 23b and the metal silicide films 26b, 26d, 30, can be obtained.

According to this embodiment, the silicide films 26a, 26c of source, drain regions and the silicide films 26b and 26d of the gate electrode, in case of IGFET, can be completely separated by the thermal silicon oxide films 29a, 29b, 29c, 29d. Therefore, a stable element such as a stable IGFET, in which any short-circuiting between the gate electrode and the source, drain regions does not occur and also a high withstand voltage therebetween is expected, can be obtained. Such a advantages are obtained by the silicon oxide films by only thermally oxidation method.

Furthermore, since in the manufacturing method of the semiconductor device of this embodiment, the formation of two kinds of metal silicide films is performed in two steps, the metal silicide films can be easily formed at the sides of the polycrystalline silicon layer. Also, since after the formation of the third metal silicide film 30 in the 2nd step, the formation of a thermal oxidation film is not necessary. Therefore, platinum, which can form a metal silicide layer at a lower temperature than a metal having a high melting point and is convenient for the manufacturing process and characters of the semiconductor device, can be used.

Figure 3A:
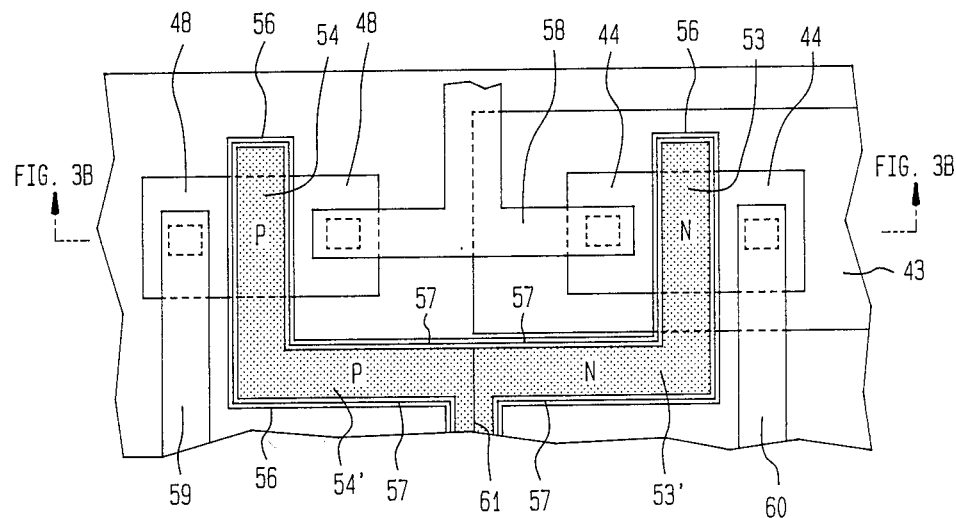
FIG. 3A is a plane view showing a semiconductor device of a second embodiment of this invention.
Figure 3B:
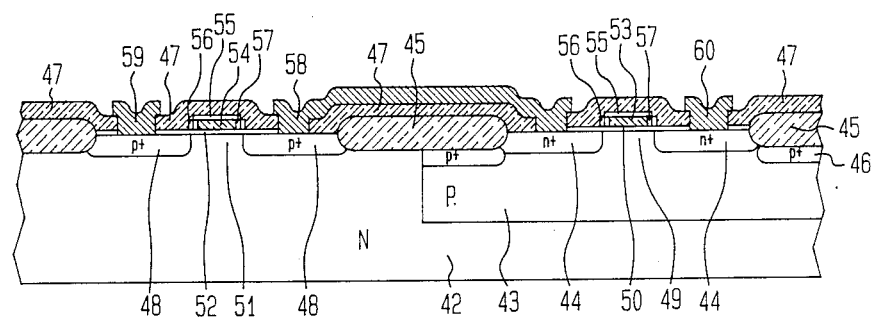
FIG. 3B is a cross-sectional view taken along the line B—B' in FIG. 3A.

Next, another embodiment of this invention applied to CMOS, that is, complementary IGFET is explained by referring to FIG. 3A and FIG. 3B. In a n-type silicon semiconductor substrate 42 is formed a p-type impurity region 43, that is, a p-well. Also, a thick field oxidation layer 45 is selectively formed and further p+-type channel stopper regions 46 are formed. In the p-type region 43 are formed n+-type source and drain regions 44 of n channel type IGFET and also in the n-type portion of the substrate, are formed p+-type source and drain regions 48 of p channel type IGFET. A polycrystalline silicon layer is provided on a gate insulating film 50 formed on a channel region 49 of the n-channel type IGFET, on the field insulating layer 45 and on a gate insulating film 52 formed on a channel region 51 of the p-channel type IGFET. A first portion 53 of the silicon layer is of n conductivity type and serves as the gate electrode of the n-channel type IGFET, and a second portion 53' of the silicon layer is also of n conductivity type and serves as a gate wiring layer of the gate electrode 53. A third portion 54 of the silicon layer is of p conductivity type and serves as the gate electrode of the p-channel type IGFET, and a fourth portion 54' of the silicon layer is also p conductivity type and serves as a gate wiring layer of the gate electrode 54. The second and fourth portions are directly connected with each other, and therefore, an undesirable pn junction 61 is formed therebetween. However, the pn junction 61 is effectively shorted by a metal silicide film 57. Namely the metal silicide film 57 by a metal having a high melting point is continuously provided at the whole sides of the first to fourth portions of the polycrystalline silicon layer as shown in FIG. 3A. Also, a silicon oxide film 56 by thermal oxidation is formed on the metal silicide film 57. In this embodiment, a metal silicide film is not provided on the upper surface of the polycrystalline silicon layer and a silicon nitride film 55 is left. Also any metal silicide film is not formed on source, drain regions 44, 48, because aluminum wiring layers 58, 59, 60 are connected these regions through contact holes provided in a passivation insulating layer 47. Namely, the source, drain regions 44, 48 of this embodiment are not elongated, and therefore, any silicide film to reduce the electrical resistance is not necessary. Moreover, if the electrical resistance of the polycrystalline silicon layer is sufficiently reduced by the side silicide film only as the embodiment shown in FIG. 3, it is not necessary to provide another silicide film on the upper surface of the silicon layer.

What is claimed is:

1. A method of manufacturing a semiconductor device comprising steps of forming a first silicon oxide film on the major surface of a single crystal silicon substrate, forming a polycrystalline silicon layer on said first silicon oxide film, forming an oxidation resisting layer on said polycrystalline silicon film, patterning said oxidation resisting film and said polycrystalline silicon layer, depositing a first metal film continuously on an exposed side surface of the patterned polycrystalline silicon layer and on an exposed major surface of said substrate in the vicinity of said patterned polycrystalline silicon layer via said first silicon oxide film, performing a heat treatment to form a first metal silicide film at said exposed side surface of said patterned polycrystalline silicon layer and a second metal silicide film at said exposed major surface of said substrate and to leave a portion of said first metal film on said first silicon oxide film unconverted into metal silicide, removing said portion of said first metal film left unconverted into metal silicide from the surface of said first silicon oxide film between said first and second metal silicide films to separate said first metal silicide film from said second metal silicide film, performing thermal oxidation to convert surface portions of said first and second metal silicide films into second oxide films, and thereafter removing said oxidation resisting film to expose said upper surface of said patterned polycrystalline silicon layer, depositing a second metal film on the whole surface including said upper surface of said polycrystalline silicon layer from which said oxidation resisting film has been removed, applying a heat treatment to form a third metal silicide film on said upper surface of said silicon layer, and removing said second metal film at the regions where said second metal silicide is not formed.

2. A method of claim 1, in which said metal film is made of molybdenum, tungsten, titanium or tantalum.

* * * * *